US012677412B2

(12) United States Patent
Liu et al.

(10) Patent No.: US 12,677,412 B2
(45) Date of Patent: Jul. 7, 2026

(54) MEMORY, STORAGE APPARATUS, AND ELECTRONIC DEVICE

(71) Applicant: HUAWEI TECHNOLOGIES CO., LTD., Shenzhen (CN)

(72) Inventors: Rongbin Liu, Shenzhen (CN); Junkeun Lee, Shenzhen (CN); Sangpil Lee, Shenzhen (CN); Sangbong Han, Shenzhen (CN); Zhengbo Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 127 days.

(21) Appl. No.: 18/669,828

(22) Filed: May 21, 2024

(65) Prior Publication Data

US 2024/0306381 A1      Sep. 12, 2024

Related U.S. Application Data

(63) Continuation of application No. PCT/CN2021/132446, filed on Nov. 23, 2021.

(51) Int. Cl.
| | |
|---|---|
| *G11C 11/409* | (2006.01) |
| *G11C 11/408* | (2006.01) |
| *G11C 11/4093* | (2006.01) |
| *H10B 12/00* | (2023.01) |

(52) U.S. Cl.
CPC .......... *H10B 12/50* (2023.02); *G11C 11/4087* (2013.01); *G11C 11/4093* (2013.01)

(58) Field of Classification Search
CPC .................................. G11C 11/4093
See application file for complete search history.

(56) References Cited

U.S. PATENT DOCUMENTS

| | | | | |
|---|---|---|---|---|
| 6,246,614 B1 * | 6/2001 | Ooishi | ................ | G11C 11/4097 |
| | | | | 365/207 |
| 6,310,815 B1 * | 10/2001 | Yamagata | ................ | G11C 5/14 |
| | | | | 365/230.03 |
| 9,165,621 B2 * | 10/2015 | Perego | ..................... | G11C 8/00 |
| 2007/0115710 A1 * | 5/2007 | Kim | ......................... | G11C 7/18 |
| | | | | 365/63 |
| 2013/0051114 A1 | 2/2013 | Kim et al. | | |

FOREIGN PATENT DOCUMENTS

CN          110197686 A      9/2019

OTHER PUBLICATIONS

Extended European Search Report in European Appln. No. 21965023. 1, mailed on Sep. 19, 2024, 7 pages.
International Search Report and Written Opinion in International Appln. No. PCT/CN2021/132446, mailed on Aug. 26, 2022, 17 pages (with English translation).

* cited by examiner

*Primary Examiner* — Hoai V Ho
(74) *Attorney, Agent, or Firm* — Fish & Richardson P.C.

(57)          ABSTRACT

This disclosure relates to storage circuits, memories, and storage apparatuses. An example memory includes a storage circuit. The storage circuit includes a first bank, a second bank, a first global data amplifier, global input/output (GIO) routing, and an interface circuit. The first bank and the second bank share the first global data amplifier, and the first global data amplifier is coupled to the interface circuit through the GIO.

20 Claims, 8 Drawing Sheets

MEMORY, STORAGE APPARATUS, AND ELECTRONIC DEVICE

CROSS-REFERENCE TO RELATED THIS DISCLOSURE

This application is a continuation of International Application No. PCT/CN2021/132446, filed on Nov. 23, 2021, the disclosure of which is hereby incorporated by reference in its entirety.

TECHNICAL FIELD

This disclosure relates to the field of data storage technologies, and in particular, to a memory, a storage apparatus, and an electronic device.

BACKGROUND

High-density dynamic random access memories (DRAMs), as main memories, are widely used in various electronic devices. As shown in FIG. 1, the DRAM usually includes a plurality of banks, a row decoder (R DEC), a column decoder (C DEC), a global data sense amplifier GSA, a power supply circuit, an interface circuit, middle input/output (MIO) routing, global input/output (GIO) routing, and the like. In FIG. 1, an example in which the DRAM includes eight banks that are represented as B0 to B7 is used for description.

Currently, to obtain a larger DRAM bandwidth, a capacity of a bank is usually divided smaller, so that a quantity of banks corresponding to a chip with a same capacity as that of a chip in the conventional technology is doubled. The DRAM architecture shown in FIG. 1 is used as an example. One bank corresponds to one GSA. When a quantity of banks is doubled, a quantity of GSAs corresponding to the banks and a length of the GIO are also doubled. Consequently, an area of the chip is increased.

Further, as shown in FIG. 2, when the DRAM includes more banks, a plurality of banks included in the DRAM are distributed in a determinant manner, banks in two adjacent rows share a horizontal GIO, and a plurality of horizontal GIOs are coupled to vertical GIOs. In FIG. 2, an example in which the DRAM includes 32 banks that are represented as B0 to B31 is used for description. However, this manner affects a load and a delay of the GIO to some extent. In addition, data of all the banks needs to be aggregated to the interface circuit; consequently, a chip area occupied by the GIO and the interface circuit increases.

SUMMARY

This disclosure provides a memory, a storage apparatus, and an electronic device, to reduce an area and power consumption of the memory.

To achieve the foregoing objectives, the following technical solutions are used in embodiments of this disclosure.

According to a first aspect, a memory is provided. The memory includes a storage circuit. The storage circuit includes a first bank, a second bank, a first global data amplifier GSA, a global input/output GIO routing, and an interface circuit. The first bank and the second bank share the first GSA, and the first GSA is coupled to the interface circuit through the GIO.

In the foregoing technical solution, a bank may be storage space including a plurality of memory arrays. The first bank and the second bank share the first GSA, and the first GSA is coupled to the interface circuit. In this way, the first GSA can be configured to amplifier data in a read/write operation process of the first bank and the second bank, to ensure normal performing of the read/write operation. In addition, the first bank and the second bank share the first GSA, while in the conventional technology, each bank corresponds to one GSA. Accordingly, when the memory includes a same quantity of banks as that included in a memory in the conventional technology, a quantity of GSAs in this disclosure can be half of a quantity of GSAs in the conventional technology. In other words, the quantity of GSAs in this disclosure is less than the quantity of GSAs in the conventional technology. Consequently, in this disclosure, the quantity of GASs in the memory is reduced, to reduce an area and power consumption of the memory.

In a possible implementation, the storage circuit further includes a first middle input/output MIO routing. The first bank and the second bank share the first MIO, and the first MIO is configured to connect the first bank, the second bank, and the first GSA.

In the foregoing possible implementation, the first bank and the second bank share the first MIO, while in the conventional technology, each bank is independently provided with a corresponding MIO. Accordingly, when the memory includes the same quantity of banks as that included in the memory in the conventional technology, a length and a load of the MIO in the memory can be reduced in this disclosure, to reduce the area and power consumption of the memory.

In a possible implementation, the storage circuit further includes a first column decoder shared by the first bank and the second bank.

In the foregoing possible implementation, the first bank and the second bank share the first column decoder, while in the conventional technology, each bank is independently provided with a corresponding column decoder. Accordingly, when the memory includes the same quantity of banks as that included in the memory in the conventional technology, a quantity of column decoders in the memory can be reduced, to reduce the area and power consumption of the memory.

In a possible implementation, the storage circuit further includes a first column decoder corresponding to the first bank and a second column decoder corresponding to the second bank. The first column decoder and the second column decoder are two independent column decoders.

In the foregoing possible implementation, the first bank and the second bank correspond to two different column decoders respectively. This can improve data read/write efficiency and read/write flexibility.

In a possible implementation, the storage circuit further includes a first column decoder corresponding to the first bank and a second column decoder corresponding to the second bank. The first column decoder and the second column decoder share at least one of the following: a decoding power supply circuit or a decoding input/output interface routing.

In the foregoing possible implementation, when the first column decoder and the second column decoder share the decoding power supply circuit and the decoding input/output interface routing, the area and power consumption of the memory can be reduced. Alternatively, the first column decoder and the second column decoder may not share the decoding circuit. In this way, when different repair operations are performed on different banks, the repair operation can be separately performed through a corresponding decoding circuit, to improve flexibility of a repair resource.

In a possible implementation, the storage circuit further includes a first row decoder, a third bank, and a fourth bank. The first bank, the second bank, the third bank, and the fourth bank share the first row decoder.

In the foregoing possible implementation, two or more banks share one row decoder, while in the conventional technology, every two banks share one row decoder. Accordingly, when the memory includes the same quantity of banks as that included in the memory in the conventional technology, a quantity of row decoders in the memory can be reduced, to reduce the area and power consumption of the memory.

In a possible implementation, the storage circuit further includes a second GSA. The third bank and the fourth bank share the second GSA.

In the foregoing possible implementation, the third bank and the fourth bank share the second GSA, while in the conventional technology, each bank corresponds to one GSA. Accordingly, when the memory includes the same quantity of banks as that included in the memory in the conventional technology, the quantity of GSAs in the memory can be reduced, to reduce the area and power consumption of the memory.

In a possible implementation, the storage circuit further includes a second MIO. The third bank and the fourth bank share the second MIO, and the second MIO is configured to connect the third bank, the fourth bank, and the second GAS.

In the foregoing possible implementation, the third bank and the fourth bank share the second MIO. Compared with that in the conventional technology in which each bank is independently provided with the corresponding MIO, when a quantity of banks included in the memory doubles, this can ensure that the length and the load of the MIO are not doubled, to reduce the area and power consumption of the memory.

In a possible implementation, the third bank and the fourth bank share the first GSA.

In the foregoing possible implementation, two or more banks share one GSA, while in the conventional technology, each bank corresponds to one GSA. Accordingly, when the memory includes the same quantity of banks as that included in the memory in the conventional technology, the quantity of GSAs can be greatly reduced, for example, the quantity of GSAs included in this disclosure may be one fourth of the quantity of GSAs included in the conventional technology, to reduce the area and power consumption of the memory.

In a possible implementation, the third bank and the fourth bank share the first MIO, and the first MIO is further configured to connect the third bank and the fourth bank.

In the foregoing possible implementation, the four banks can share the first MIO, while in the conventional technology, each bank is independently provided with the corresponding MIO. Accordingly, when the memory includes the same quantity of banks as that included in the memory in the conventional technology, the length and the load of the MIO can be greatly reduced, to reduce the area and power consumption of the memory.

In a possible implementation, the storage circuit further includes a third column decoder shared by the third bank and the fourth bank.

In the foregoing possible implementation, the third bank and the fourth bank share the third column decoder, while in the conventional technology, each bank is independently provided with the corresponding column decoder. Accordingly, when the memory includes the same quantity of banks as that included in the memory in the conventional technology, the quantity of column decoders can be reduced, to reduce the area and power consumption of the memory.

In a possible implementation, the storage circuit further includes a selection circuit, configured to select the first bank or the second bank to connect to the first GSA. Optionally, each of the first bank and the second bank includes at least one section, and the selection circuit is further configured to select one of the at least one section to connect to the first GSA. Optionally, the at least one section includes a plurality of memory arrays, and the selection circuit is further configured to select one of the plurality of memory arrays to connect to the first GSA.

In the foregoing possible implementation, the selection circuit may select any bank, any section, or any memory array for connection, to implement corresponding read/ write.

In a possible implementation, the interface circuit includes a first interface circuit and a second interface circuit, where the first interface circuit is configured to: input or output data, and convert the data, and the second interface circuit is configured to: input or output a command, and decode or convert the command;

In a possible implementation, the storage circuit further includes at least one of the following circuits that are coupled to the GIO: a power supply circuit and a test circuit.

In a possible implementation, the memory includes a plurality of channels, and each of the plurality of channels includes the storage circuit.

In the foregoing possible implementation, when the memory includes the plurality of channels, an area and power consumption of each channel can be reduced, to reduce the area and power consumption of the entire memory.

In a possible implementation, the memory is a dynamic random access memory DRAM.

According to a second aspect, a storage apparatus is provided. The storage apparatus includes a printed circuit board and a memory that is connected to the printed circuit board. The memory is the memory according to any one of the first aspect or the possible implementations of the first aspect.

According to a third aspect, a storage apparatus is provided. The storage apparatus includes a controller and a memory. The controller is configured to control read/write of the memory. The memory is the memory according to any one of the first aspect or the possible implementations of the first aspect.

According to a fourth aspect, an electronic device is provided. The electronic device includes a processor and a memory that are coupled to each other. The memory is the memory according to any one of the first aspect or the possible implementations of the first aspect.

It may be understood that any one of the storage apparatus and the electronic device provided above includes content of the memory provided above. Therefore, for beneficial effects that can be achieved by the storage apparatus and the electronic device, refer to the beneficial effects of the memory provided above. Details are not described herein again.

DESCRIPTION OF EMBODIMENTS

Figure 1:
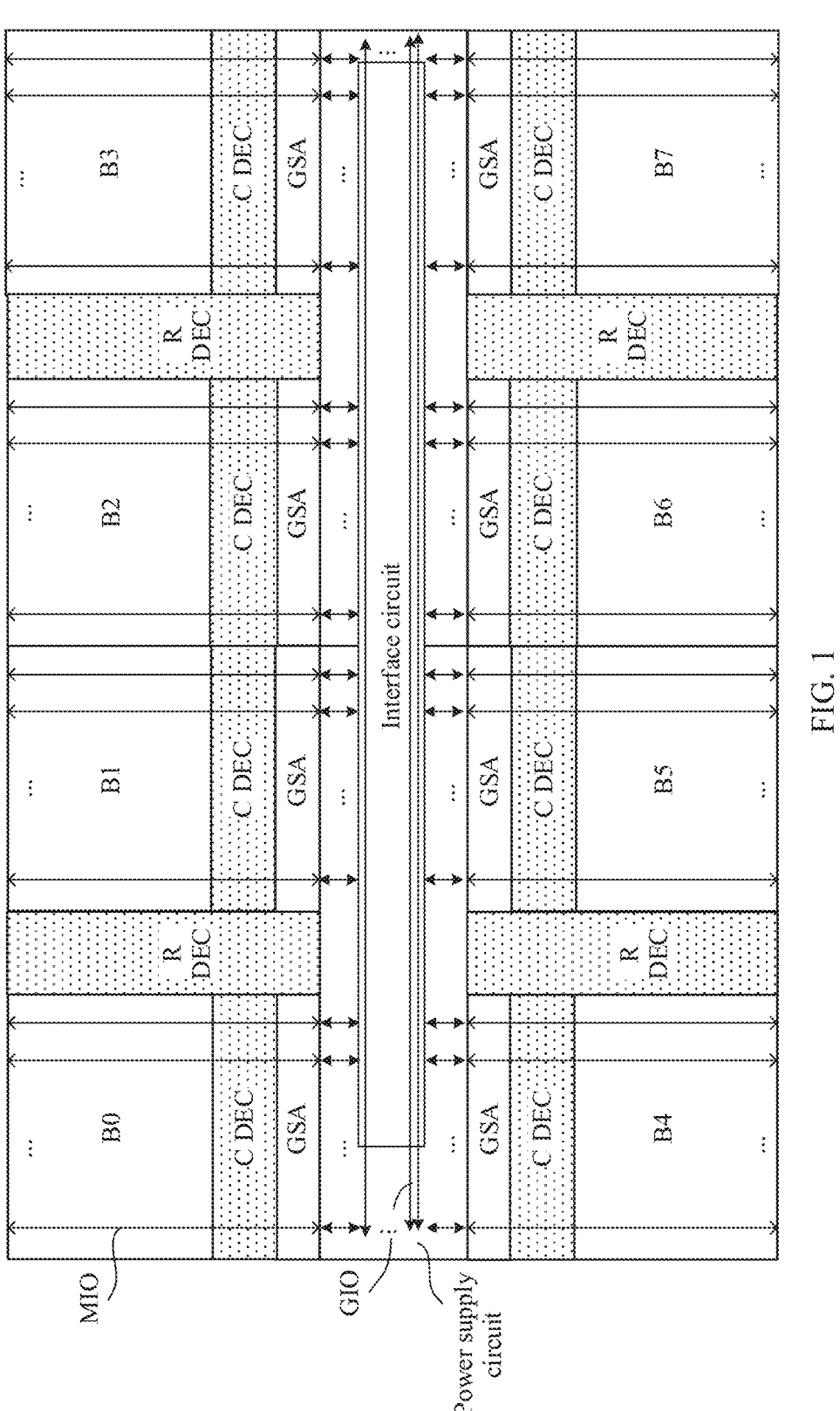
FIG. 1 is a schematic diagram of a structure of a memory in the conventional technology.
Figure 2:
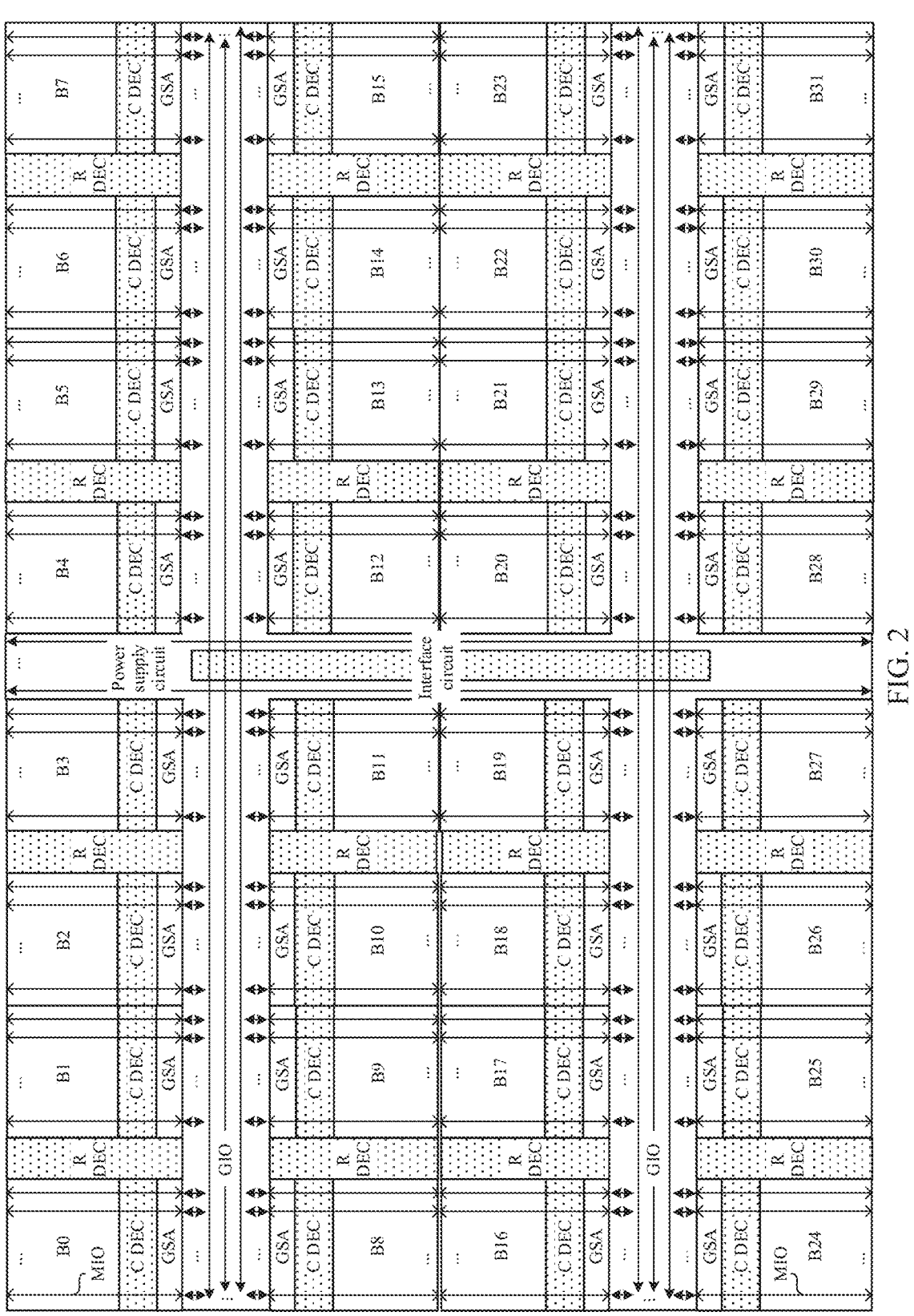
FIG. 2 is a schematic diagram of a structure of another memory in the conventional technology.

The making and use of embodiments are discussed in detail below. It should be appreciated, however, that many applicable inventive concepts provided in this disclosure may be implemented in a plurality of specific environments. The specific embodiments discussed are merely illustrative of specific ways to implement and use this description and this technology, and do not limit the scope of this disclosure.

Unless otherwise defined, all technical terms used herein have the same meaning as those commonly known to a person of ordinary skill in the art.

The circuits or other components may be described as or referred to as "configured to" perform one or more tasks. In this case, the term "configured to" is used for implying a structure by indicating that a circuit/component includes a structure (for example, a circuit system) that performs one or more tasks during operation. Therefore, even when a specified circuit/component is currently not operable (for example, not connected), the circuit/component may also be referred to as being configured to perform the task. Circuits/ components used in conjunction with the "configured to" phrase include hardware, for example, a circuit for performing an operation.

The following describes the technical solutions in embodiments of this disclosure with reference to the accompanying drawings in embodiments of this disclosure. In this disclosure, "at least one" refers to one or more, "a plurality of" refers to two or more, and "and/or" describes an association relationship between associated objects, and indicates that three relationships may exist. For example, A and/or B may represent the following cases: Only A exists, both A and B exist, and only B exists, where A and B may be singular or plural. The character "/" generally indicates an "or" relationship between the associated objects. "At least one of the following items (pieces)" or a similar expression thereof refers to any combination of these items, including any combination of singular items (pieces) or plural items (pieces). For example, at least one item (piece) of a, b, or c may represent: a, b, c, a and b, a and c, b and c, or a, b, and c, where a, b, and c may be singular or plural. In addition, in embodiments of this disclosure, words such as "first" and "second" do not limit a quantity or a sequence.

It should be noted that, in this disclosure, words such as "example" or "for example" indicate giving an example, an illustration, or a description. Any embodiment or design scheme described as an "example" or "for example" in this disclosure should not be explained as being more preferred or having more advantages than another embodiment or design scheme. Exactly, use of the words such as "example" or "for example" is intended to present a related concept in a specific manner.

The technical solutions of this disclosure may be applied to various electronic devices including a memory. For example, the technical solutions of this disclosure may be applied to a computer, a tablet computer, a notebook computer, a mobile phone, a netbook, a wearable device, a vehicle-mounted device, or a camera device. The electronic device in this disclosure may include only a memory, or may include both a processor and a memory. The processor may be a central processing unit (CPU), an artificial intelligence (AI) processor, a digital signal processor (DSP), a neural network processor, or the like. During actual application, the electronic device may further include one or more of a plurality of modules such as a communication module, a sensor module, a display module, and an input/output module. In an embodiment, a structure of the electronic device is not limited in embodiments of this disclosure.

The technical solutions of this disclosure may be applied to various memories, for example, a random access memory (RAM) and a read-only memory (ROM). The ROM may include an electrically programmable read-only memory (EPROM), an electrically erasable programmable read-only memory E2PROM), a flash memory, and the like. The RAM may include a static random access memory (SRAM), a dynamic random access memory (DRAM), a synchronous dynamic random access memory (SDRAM), and the like. These are not described one by one in embodiments of this disclosure.

The following describes a plurality of technical terms related to the memory in embodiments of this disclosure.

A memory cell is a unit of storage at a minimum granularity, and may be configured to store 1-bit data.

A memory array includes memory cells in a plurality of rows and a plurality of columns. Memory cells included in each of the plurality of rows share one row address, and memory cells included in each of the plurality of columns share one column address. In this way, one row address and one column address may be used to uniquely determine one memory cell.

A section includes a plurality of memory arrays.

A bank includes one or more sections, and each section includes a plurality of memory arrays. Therefore, the bank may also be referred to as including the plurality of memory arrays.

A channel is independent accessible memory space. The memory space may include one or more memory arrays, banks, sections, or the like. One channel usually includes memory space with a specific capacity and a hardware circuit configured to access the memory space. The hardware circuit may include a circuit related to control logic and an interface.

A global data amplifier is a circuit configured to amplifier a signal corresponding to data read from a bank, so that the data can be effectively identified based on the signal, and is configured to write data into the bank by using a driving function. In other words, the global data amplifier has data amplification and driving functions. For example, the global data amplifier may be a global data sense amplifier (GSA/ DSA), and the GSA may include a signal amplifier and a data drive circuit. In the following, an example in which the global data amplifier is the global data sense amplifier and is represented as the GSA is used for description.

An interface circuit is an interface-related circuit configured to: receive data input from an external device, and output data to the external device. An interface circuit 13 may include a first interface circuit and a second interface circuit. The first interface circuit is configured to: input or output the data, and convert the data. The second interface circuit is configured to: input or output a command, encode or decode and convert the command.

Middle input/output (MIO) routing is a routing between a section and a GSA, and may be used for data transmission between the section and the GSA.

Global input/output (GIO) routing is a routing between a GSA and an interface circuit, and may be used for data transmission between the GSA and the interface circuit.

Figure 3:
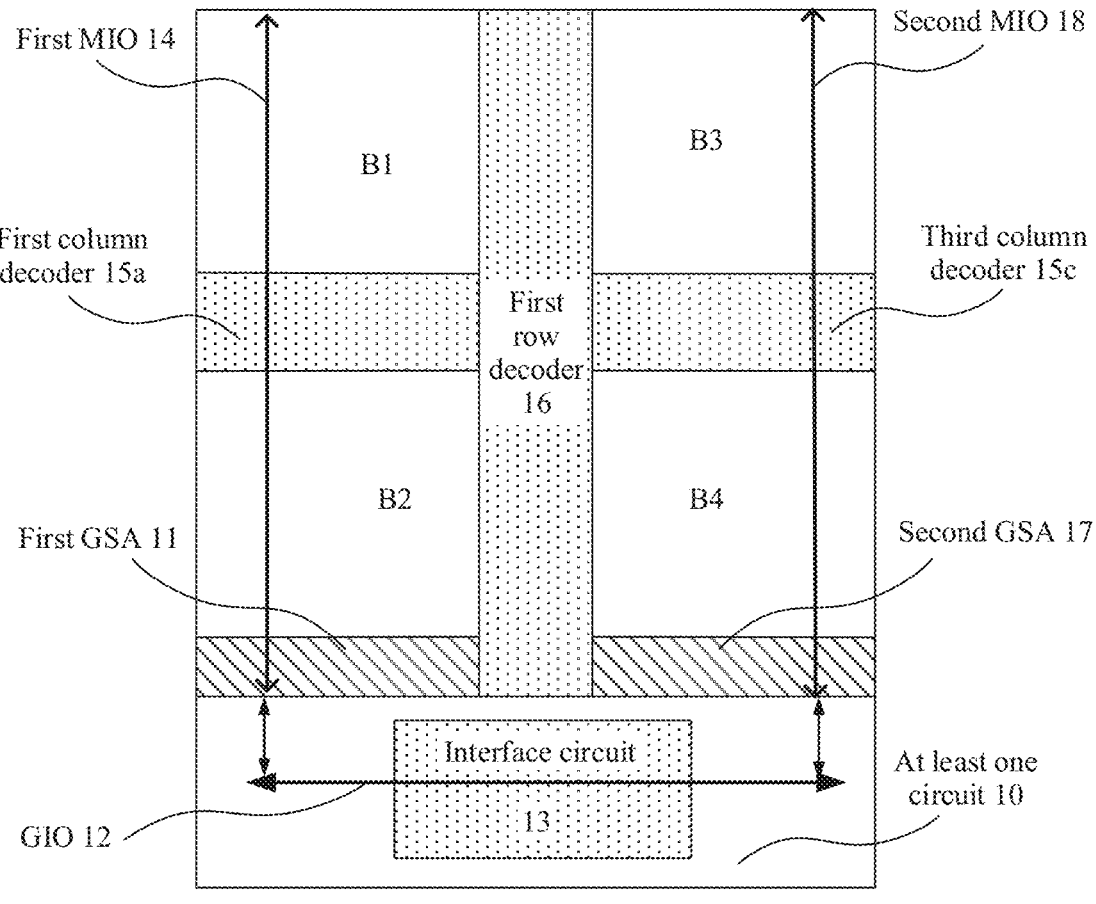
FIG. 3 is a schematic diagram of a structure of a memory according to an embodiment of this disclosure.

FIG. 3 is a schematic diagram of a structure of a memory according to an embodiment of this disclosure. The memory may be any memory listed above. For example, the memory may be a DRAM. As shown in FIG. 3, the memory includes a storage circuit 1. The storage circuit 1 includes a first storage bank B1, a second bank B2, a first GSA 11, a GIO 12, and an interface circuit 13. The first bank B1 and the second bank B2 share the first GSA 11, and the first GSA 11 is coupled to the interface circuit 13 through the GIO 12.

The storage circuit 1 may include a plurality of banks, and the first bank B1 and the second bank B2 may be any two of the plurality of banks. Optionally, the first bank B1 and the second bank B2 are two adjacent banks. For example, in FIG. 3, an example in which the first bank B1 and the second bank B2 are two adjacent banks in a same column is used for description.

In addition, the first GSA 11 has data amplification and driving functions, and the first bank B1 and the second bank B2 share the first GSA 11, so that the first GSA 11 may be configured to amplifier data read from the first bank B1 or the second bank B2, or may write data into the first bank B1 or the second bank B2 by using the driving function. Optionally, when the first bank B1 and the second bank B2 share the first GSA 11, the first bank B1 and the second bank B2 may share the first GSA 11 in a time-division multiplexing manner.

In addition, the interface circuit 13 may be configured to: receive data input from an external device, output data in the memory to the external device, and convert the input data or the output data, for example, convert the input data from parallel data into serial data, or convert the output data from serial data into parallel data, and then output the converted data. In addition, the interface circuit 13 may be configured to: receive a command input from an external device or output a command to an external device, encode or decode and convert the input command or the output command.

Optionally, the interface circuit 13 may include a first interface circuit and a second interface circuit. The first interface circuit is configured to: input or output the data, and convert the data. The second interface circuit is configured to: input or output the command, encode or decode and convert the command.

During actual application, the storage circuit 1 may further include at least one circuit 10 that is coupled to the GIO 12: a power supply circuit and a test circuit. The power supply circuit may be configured to supply power to each circuit included in the storage circuit 1. For example, the power supply circuit may be a direct current (DC) power supply. The test circuit may be configured to test the storage circuit 1. For example, the test circuit may be configured to test whether a bank in the storage circuit 1 is faulty and a plurality of different parameters such as a delay and power consumption during data storage or read. It should be noted that, in addition to the power supply circuit and the test circuit, the at least one circuit 10 may further include another circuit. In an embodiment, this is not limited in embodiments of this disclosure.

In an embodiment, when the memory stores the data input from the external device in the first bank B1 or the second bank B2, the interface circuit 13 may transmit the received data to the first GSA 11 through the GIO 12, and the first GSA 11 stores the data in the first bank B1 or the second bank B2 by using the driving function. When the memory outputs data stored in the first bank B1 or the second bank B2 to the external device, the first bank B1 or the second bank B2 may read the to-be-output data and then transmit the to-be-output data to the first GSA 11. The first GSA 11 amplifies the data and transmits amplified data to the interface circuit 13 through the GIO 12. The interface circuit 13 converts the amplified data and outputs converted data to the external device.

In the foregoing memory, the first bank B1 and the second bank B2 in the storage circuit 1 share the first GSA 11, and the first GSA 11 is coupled to the interface circuit 13 through the GIO 12, so that the first GSA 11 can be configured to amplifier data in a read/write operation process of the first bank B1 and the second bank B2, to ensure normal performing of the read/write operation. In addition, the first bank B1 and the second bank B2 share the first GSA 11, while in the conventional technology, each bank corresponds to one GSA. Accordingly, when the memory includes a same quantity of banks as that included in a memory in the conventional technology, a quantity of GSAs in the memory can be reduced, to reduce an area and power consumption of the memory storage.

Further, as shown in FIG. 3, the storage circuit 1 includes first middle input/output MIO routing 14. The first bank B1 and the second bank B2 share the first MIO 14, and the first MIO 14 is configured to connect the first bank B1, the second bank B2, and the first GSA 11.

Optionally, the first bank B1 and the second bank B2 are two adjacent banks. The first GSA 11 is adjacent to the second bank B2. The first MIO 14 extends from a side that is of the first bank B1 and that is away from the second bank B2 to a side that is of the first GSA 11 and that is away from the second bank B2.

In an embodiment, when the data is stored in the first bank B1 or the second bank B2, data processed by the GSA 11 may be transmitted to the first bank B1 or the second bank B2 through the first MIO 14 for storage. Alternatively, when the data in the first bank B1 or the second bank B2 is read, the data may be transmitted to the first GSA 11 through the first MIO 14, so that the data is amplified by the first GSA 11 and then amplified data is output through the interface circuit 13. In this embodiment of this disclosure, the first bank B1 and the second bank B2 share the first MIO 14, and the MIO is usually routing with a low swing, while in the conventional technology, each bank is independently provided with a corresponding MIO. Accordingly, when the memory includes the same quantity of banks as that included in a memory in the conventional technology, a length and a load of the MIO can be reduced, to reduce the area and power consumption of the memory.

Further, the storage circuit 1 may include a column decoder 15. The first bank B1 and the second bank B2 may share a same column decoder, or correspond to two different column decoders respectively, or correspond to two column decoders that share some functions. The following separately describes the several cases in detail.

Case 1: As shown in FIG. 3, the storage circuit 1 further includes a first column decoder 15a. The first bank B1 and the second bank B2 may share the first column decoder 15a. Optionally, the first column decoder 15a may be located between the first bank B1 and the second bank B2.

The sharing the first column decoder 15a may mean that all functions or components of the first column decoder 15a are shared. In an example, the first column decoder 15a includes a decoding circuit, a decoding power supply circuit, and decoding input/output interface routing. The first bank B1 and the second bank B2 may share the decoding circuit, the decoding power supply circuit, and the decoding input/output interface routing.

In an embodiment when the first bank B1 and the second bank B2 share the first column decoder 15a, the first bank B1 and the second bank B2 may share the first column decoder 15a in a time-division multiplexing manner. In other words, the first column decoder 15a is configured to separately perform, in different time periods, column address decoding on data in read/write operations corresponding to the first bank B1 and the second bank B2. Optionally, when same data needs to be written into the first bank B1 and the second bank B2, both the first bank B1 and the second bank B2 may use the first column decoder 15a. In the foregoing solution, the first bank B1 and the second bank B2 may share the first column decoder 15a, while in the conventional technology, each bank is independently provided with a corresponding column decoder. Accordingly, when the memory includes a same quantity of banks as that included in the memory in the conventional technology, a quantity of column decoders in the memory can be reduced, to reduce the area and power consumption of the memory.

Figure 4:
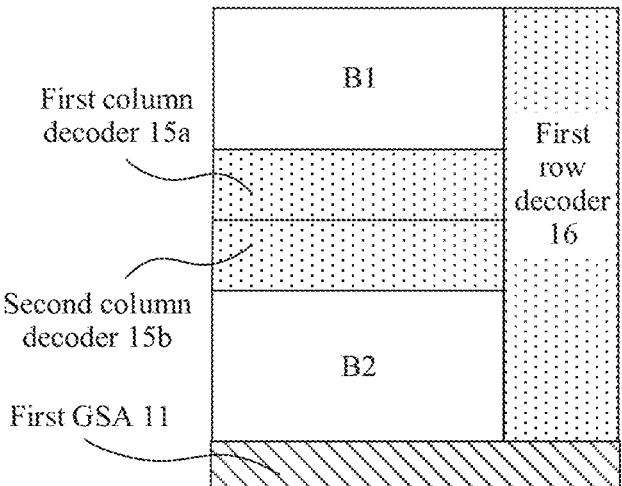
FIG. 4 is a schematic diagram of a column decoder in a memory according to an embodiment of this disclosure.

Case 2: As shown in FIG. 4, the storage circuit 1 further includes a first column decoder 15a corresponding to the first bank B1 and a second column decoder 15b corresponding to the second bank B2. The first column decoder 15a and the second column decoder 15b are two independent column decoders. Optionally, the first bank B1 is adjacent to the first column decoder 15a, and the second bank B2 is adjacent to the second column decoder 15b. FIG. 4 shows only a partial structure of the storage circuit 1.

In an embodiment, the first column decoder 15a is configured to perform column address decoding on data in the read/write operation corresponding to the first bank B1, and the second column decoder 15b is configured to perform column address decoding on data in the read/write operation corresponding to the second bank B2. In the foregoing solution, the first bank B1 and the second bank B2 correspond to two different column decoders respectively. This can improve data read/write efficiency and read/write flexibility.

Case 3: The storage circuit 1 further includes a first column decoder corresponding to the first bank B1 and a second column decoder corresponding to the second bank B2. The first column decoder and the second column decoder share at least one of the following: a decoding power supply circuit or decoding input/output interface routing.

In an embodiment, when the first column decoder and the second column decoder share the decoding power supply circuit and the decoding input/output interface routing, the first column decoder and the second column decoder may share the decoding power supply circuit and the decoding input/output interface routing in the time-division multiplexing manner. In this way, the first column decoder and the second column decoder can separately perform, in the time-division multiplexing manner, column address decoding on data in the read/write operations corresponding to the first bank B1 and the second bank B2. Optionally, when same data needs to be written into the first bank B1 and the second bank B2, the first column decoder and the second column decoder can work at the same time, that is, use the decoding power supply circuit and the decoding input/output interface routing at the same time. In the foregoing solution, when the first column decoder and the second column decoder share the decoding power supply circuit and the decoding input/output interface routing, the area and power consumption of the memory can be reduced. In addition, compared with that in the foregoing first solution, flexibility of a repair resource can be further improved.

Further, the storage circuit 1 includes a row decoder. The row decoder is configured to decode a row address of data that is input to the bank or a row address of data that is output from the bank. The first bank B1 and the second bank B2 may share a same row decoder, or correspond to two different row decoders respectively, or correspond to two row decoders that share some functions.

It should be noted that descriptions of the first bank B1 and the second bank B2 and the corresponding row decoder in different cases are similar to the descriptions of the first bank B1 and the second bank B2 and the corresponding column decoder in the different cases. For details, refer to the foregoing related descriptions. Details are not described herein again in this embodiment of this disclosure.

In addition, the following uses an example in which the first bank B1 and the second bank B2 may share the first column decoder 15 and a first row decoder 16 for description. Certainly, the descriptions of another case in the foregoing are also applicable to any memory provided in embodiments of this disclosure. The following figures do not constitute a limitation on embodiments of this disclosure.

Further, the storage circuit 1 includes a third column decoder 15c, a third bank B3, and a fourth bank B4. The third bank B3 and the fourth bank B4 may share the third column decoder 15c. The first bank B1, the second bank B2, the third bank B3, and the fourth bank B4 may share the first row decoder 16. On the basis that the first bank B1, the second bank B2, the third bank B3, and the fourth bank B4 share the first row decoder 16, the following separately describes, by using two embodiments, a structure of the memory used based on whether the third bank B3 and the fourth bank B4 share the first GSA 11 and the first MIO 14.

In a possible embodiment, the third bank B3 and the fourth bank B4 do not share the first GSA 11. For example, as shown in FIG. 3, the storage circuit 1 further includes a second GSA 17. The third bank B3 and the fourth bank B4 share the second GSA 17. The second GSA 17 is configured to perform processing such as amplification on data that needs to be stored in the third bank B3 or the fourth bank B4 and data that is read from the third bank B3 or the fourth bank B4.

In addition, as shown in FIG. 3, the storage circuit 1 may further include a second MIO 18. The third bank B3 and the fourth bank B4 share the second MIO 18, and the second MIO 18 is configured to connect the third bank B3, the fourth bank B4, and the second GSA 17. In an embodiment, the second MIO 18 is configured to transmit the data in the third bank B3 or the fourth bank B4 to the second GSA 17, or transmit data amplified by the second GSA 17 to the third bank B3 or the fourth bank B4.

Optionally, the third bank B3 and the fourth bank B4 are two adjacent banks. The second GSA 17 is adjacent to the fourth bank B4. The second MIO 18 extends from a side that is of the third bank B3 and that is away from the fourth bank B4 to a side that is of the second GSA 17 and that is away from the fourth bank B4.

During actual application, the storage circuit 1 may include more banks. The more banks may be distributed on two sides of the interface circuit 13, and may be arranged in a matrix manner. As shown in (a) in FIG. 5, an example in which the storage circuit 1 may include eight banks that are represented as B1 to B8, B1 to B4 are arranged in the matrix manner on one side of the interface circuit 13, and B5 to B8 are arranged in the matrix manner on the other side of the interface circuit 13 is used for description. 11' and 17' in (a) in FIG. 5 respectively represent GSAs corresponding to B5 to B8, 15a' and 15c' respectively represent column decoders corresponding to B5 to B8, and 14' and 18' respectively represent MIOs corresponding to B5 to B8.

Figure 5:
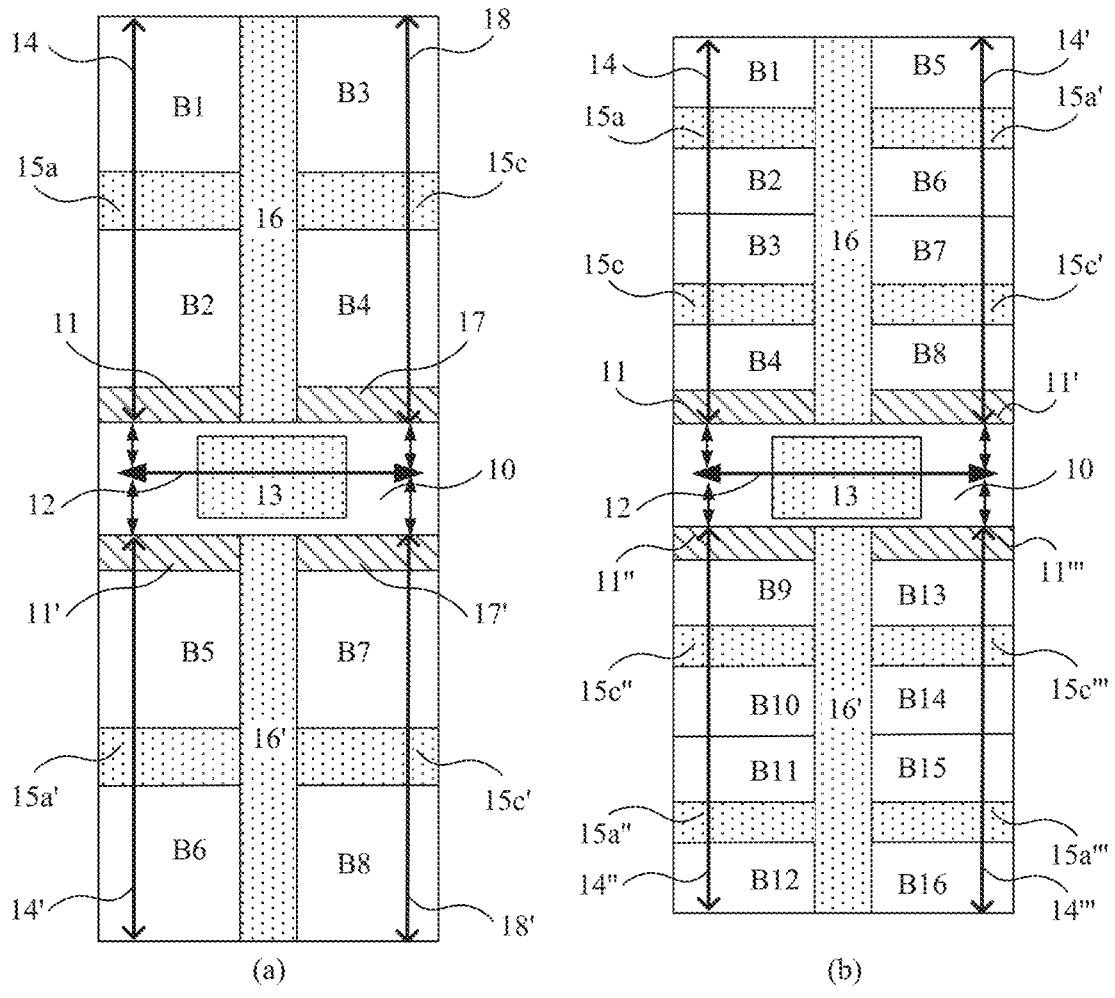
FIG. 5 is a schematic diagram of a structure of another memory according to an embodiment of this disclosure.

In another possible embodiment, as shown in (b) in FIG. 5, the third bank B3 and the fourth bank B4 share the first GSA 11. In other words, the first GSA 11 is further configured to perform processing such as amplification on data that needs to be stored in the third bank B3 or the fourth bank B4 and data that is read from the third bank B3 or the fourth bank B4.

In addition, as shown in (b) in FIG. 5, the third bank B3 and the fourth bank B4 share the first MIO 14, and the first MIO 14 is further configured to connect the third bank B3 and the fourth bank B4. In an embodiment, the first MIO 14 is further configured to transmit the data in the third bank B3 or the fourth bank B4 to the first GSA 11, or transmit data amplified by the first GSA 11 to the third bank B3 or the fourth bank B4.

Optionally, the first bank B1, the second bank B2, the third bank B3, and the fourth bank B4 are four adjacent banks. The first GSA 11 is adjacent to the fourth bank B4. The first MIO 14 extends from a side that is of the first bank B1 and that is away from the second bank B2 to a side that is of the first GSA 11 and that is away from the fourth bank B4.

During actual application, the storage circuit 1 may include more banks. The more banks may be distributed on two sides of the interface circuit 13, and may be arranged in a matrix manner. In (b) in FIG. 5, an example in which the storage circuit 1 includes 16 banks that are represented as B1 to B16, B1 to B8 are arranged in the matrix manner on one side of the interface circuit 13, and B9 to B16 are arranged in the matrix manner on the other side of the interface circuit 13 is used for description. In (b) in FIG. 5, 14' represents an MIO shared by B5 to B8, 15a' and 15c' represent column decoders corresponding to B5 to B8, 11' represents a GSA shared by B5 to B8, 14" and 14''' represent MIOs corresponding to B9 to B16, 15a", 15a''', 15c", and 15c''' respectively represent column decoders corresponding to B9 to B16, and 11" and 11''' represent GSAs corresponding to B9 to B16.

Further, the storage circuit 1 may include a selection circuit. When the plurality of banks in the storage circuit 1 share one GSA, the selection circuit is configured to select one of the plurality of banks to connect to the GSA. For example, the first bank B1 and the second bank B2 in the storage circuit 1 share the first GSA 11, and the selection circuit is configured to select the first bank B1 or the second bank B2 to connect to the first GSA 11.

In addition, when the plurality of banks share one GSA, and each of the plurality of banks includes at least one section, the selection circuit is further configured to select one of the at least one section to connect to the GSA. When each of the at least one section includes a plurality of memory arrays, the selection circuit is further configured to select one of the plurality of memory arrays to connect to the GSA. For example, each of the first bank B1 and the second bank B2 includes at least one section, and each section includes a plurality of memory arrays. The selection circuit is further configured to: select one of the at least one section to connect to the first GSA 11, and select one memory array in the section to connect to the first GSA 11.

Figure 6:
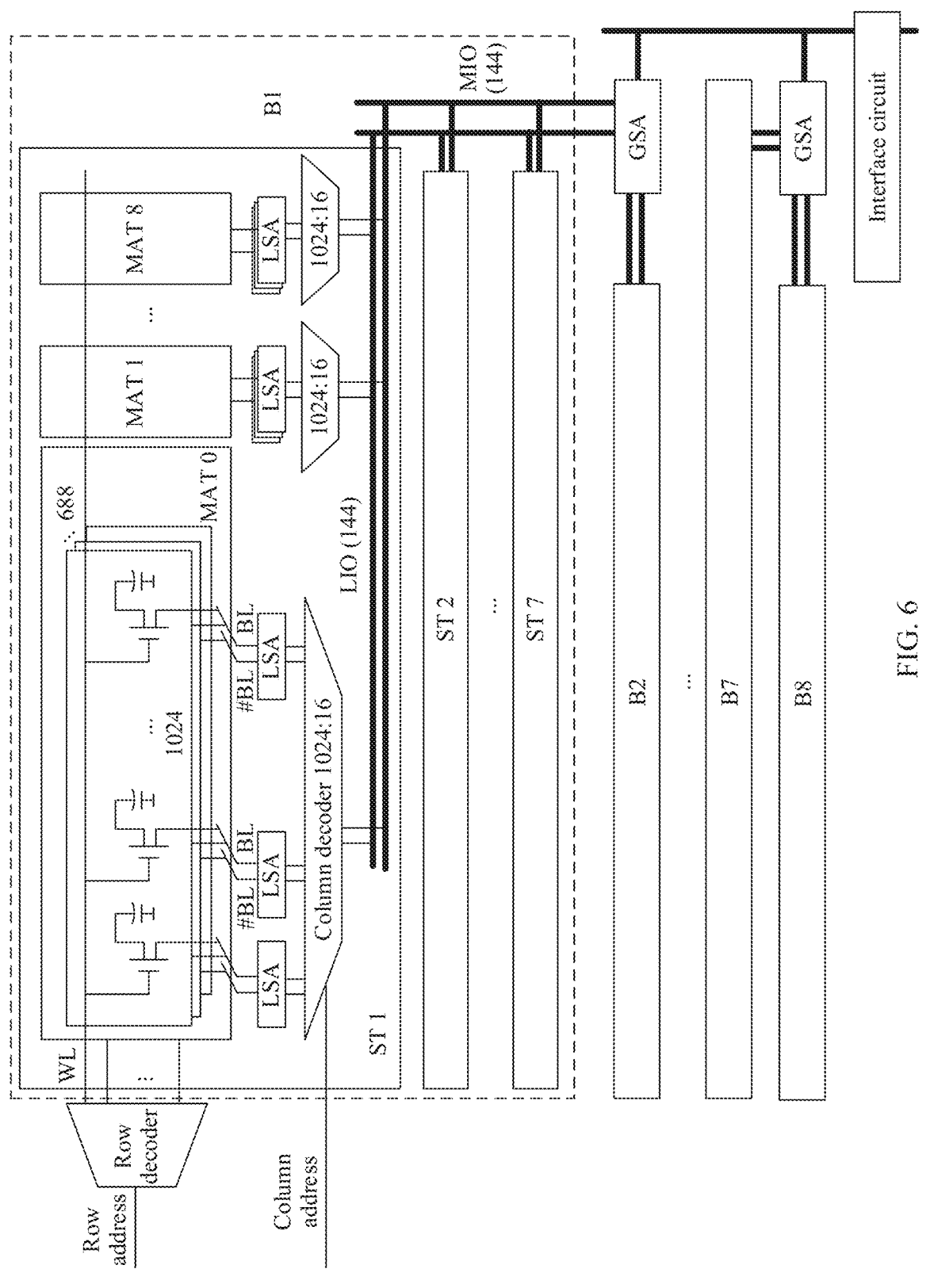
FIG. 6 is a schematic diagram of a structure of still another memory according to an embodiment of this disclosure.
Figure 7:
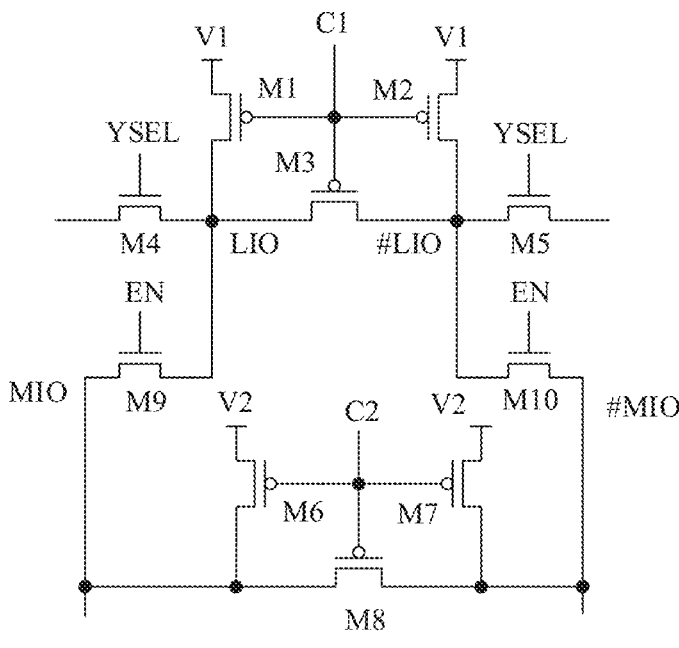
FIG. 7 is a schematic diagram of a structure of a selection circuit according to an embodiment of this disclosure.

For ease of understanding, the following uses FIG. 6 and FIG. 7 as examples to describe in detail structures of the bank and the selection circuit in the storage circuit 1 and a process of reading/writing the data from/in the bank.

In FIG. 6, an example in which the storage circuit 1 includes eight banks (represented as B1 to B8), every two banks share one GSA, each bank includes seven sections (represented as ST 1 to ST 7), each section includes nine memory arrays (represented as MAT 0 to MAT 8), each memory array includes 688 rows, and each row includes 1024 memory cells is used for description. A word line (WL) of each memory cell of MAT 0 to MAT 8 is connected to a row decoder. Bit lines (BLs) of a plurality of memory cells in different rows in each memory array corresponding to a same location and the inversion (represented as #BL) of the bit lines are all connected to a local amplifier (LSA). A plurality of LSAs corresponding to a same memory array are all connected to a column decoder. A plurality of column decoders corresponding to MAT 0 to MAT 8 are all connected to local input/output (LIO) routing. LIOs corresponding to ST 1 to ST 7 are connected to an MIO.

For example, data is read from the memory cell in the bank. A process of reading the data may include: 1. A value of the memory cell reaches, through a bit line BL or the inversion #BL of the bit line, an LSA for output. Each memory array has 1024 memory cells, so that 1024 pieces of data can be read at the same time. 2. A column decoder selects, based on a column address selection relationship, 16 pieces of data from the 1024 pieces of data for output, that is, selects one piece of data from every 64 pieces of data for output. There are 64 column addresses in total. 3. The selected 16 pieces of data are output through LIOs. During normal access, only one row address of the bank is selected at a time. Therefore, in LIOs corresponding to different sections, corresponding data is transmitted on only one group of LIOs because of a row address selection relationship. There are 144 groups of LIOs in total. 4. The selected LIO transmits the corresponding data to an MIO. A plurality of banks share the MIO. Data in only one bank is output from the MIO (144 groups of MIOs are shared) at a time. The MIO aggregates the data to a same GSA through selection. In this way, the GSA is shared. 5. The GSAs aggregate processed data to a GIO. 6. Different groups of GIOs output aggregated data to the interface circuit 13 based on a decoding selection relationship. It should be noted that a process of writing data into the memory cell in the bank is an inverse process of the foregoing data reading process. A specific process is similar to that in the foregoing descriptions. Details are not described herein again in this embodiment of this disclosure.

FIG. 7 is a schematic diagram of a structure of the selection circuit according to an embodiment of this disclosure. The selection circuit includes 10 transistors that are respectively represented as M1 to M10. A gate of a first transistor M1, a gate of a second transistor M2, and a gate of a third transistor M3 are connected and configured to receive a first control signal C1. An electrode of the first transistor M1 and an electrode of the second transistor M2 are both connected to a first voltage end V1. Another electrode of the first transistor M1, an electrode of the third transistor M3, and an electrode of a fourth transistor M4 are connected and connected to an LIO. A gate of the fourth transistor M4 is configured to receive a column gating signal Y-Selection (YSEL). Another electrode of the fourth transistor M4 is configured to receive a BL. Another electrode of the second transistor M2, another electrode of the third transistor M3, and an electrode of a fifth transistor M5 are connected to a #LIO (namely, inversion of the LIO). A gate of the fifth transistor M5 is configured to receive the column gating signal YSEL. Another electrode of the fifth transistor M5 is configured to receive a #BL. A gate of a sixth transistor M6, a gate of a seventh transistor M7, and a gate of an eighth transistor M8 are connected and configured to receive a second control signal C2. An electrode of the sixth transistor M6 and an electrode of the seventh transistor M7 are both connected to a second voltage end V2. Another electrode of the sixth transistor M6, an electrode of the eighth transistor M8, and an electrode of a ninth transistor M9 are connected and connected to an MIO. A gate of the ninth transistor M9 is configured to receive an enable signal EN. Another electrode of the ninth transistor M9 is connected to the LIO. Another electrode of the seventh transistor M7, another electrode of the eighth transistor M8, and an electrode of a tenth transistor M10 are connected to a #MIO (namely, inversion of the MIO). A gate of the tenth transistor M10 is configured to receive the enable signal EN. Another electrode of the enable signal EN is connected to the #MIO. Optionally, the first transistor M1, the second transistor M2, the third transistor M3, the sixth transistor M6, the seventh transistor M7, and the eighth transistor M8 may be PMOS transistors, and the fourth transistor M4, the fifth transistor M5, the ninth transistor M9, and the tenth transistor M10 may be NMOS transistors.

Figure 8:
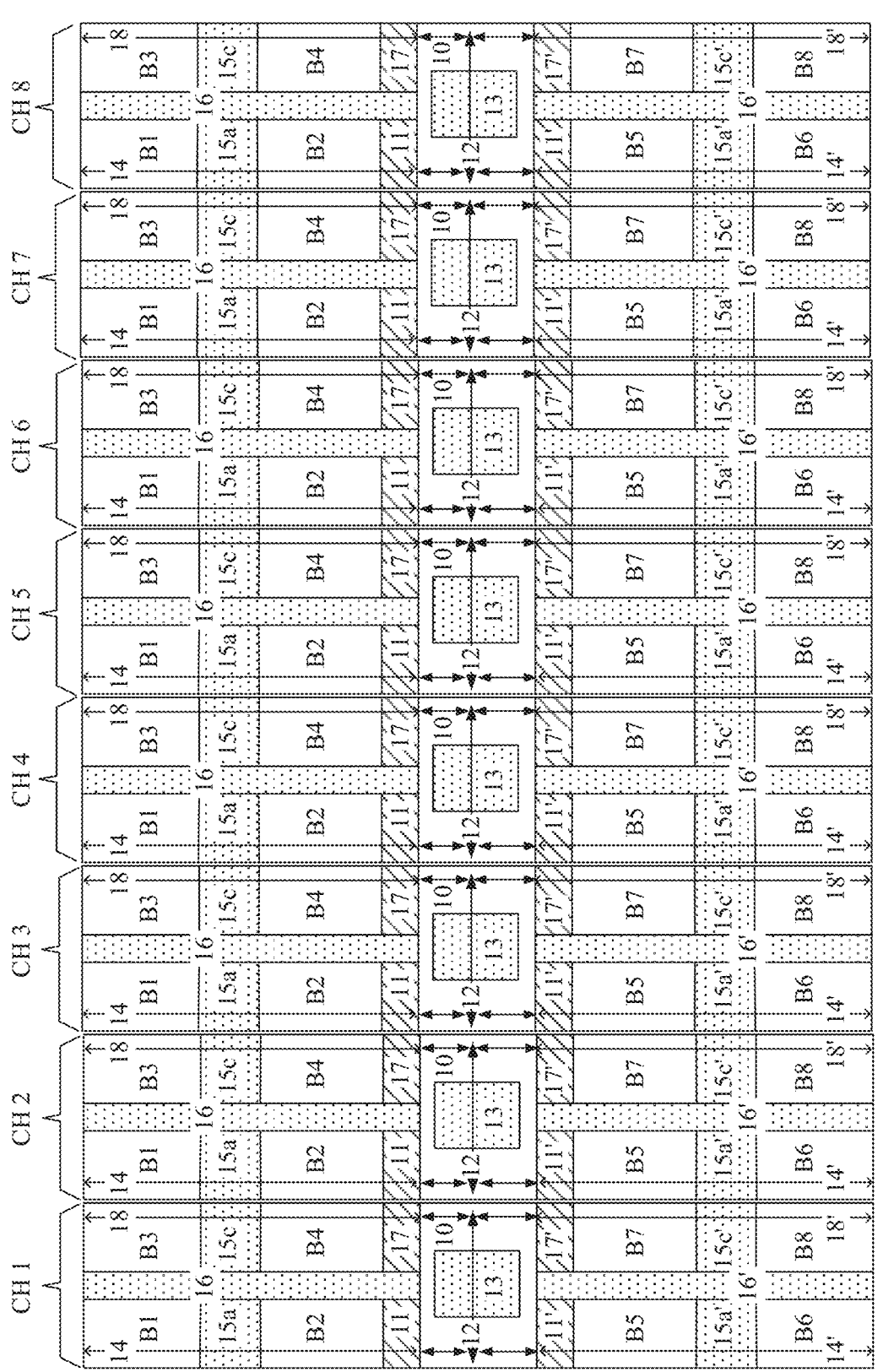
FIG. 8 is a schematic diagram of a structure of another memory according to an embodiment of this disclosure.

It should be noted that the selection circuit may include a first child circuit formed by a plurality of first transistors M1, second transistors M2, and third transistors M3, a second child circuit formed by a plurality of fourth transistors M4 and fifth transistors M5, and a third child circuit formed by a plurality of fifth transistors M5 to tenth transistors M10. In FIG. 8, one first child circuit, one second child circuit, and one third child circuit are used as an example for description.

In an embodiment, the YSEL is used to control a working status of the fourth transistor M4 and the fifth transistor M5, namely, a conducted state or a cut-off state. When the YSEL is at a high level, the fourth transistor M4 and the fifth transistor M5 are conducted, and the signal is transmitted from the BL to the LIO. When the YSEL is at a low level, the fourth transistor M4 and the fifth transistor M5 are cut off. In other words, the BL and the LIO are not selected. Similarly, the EN is used to control the working status of the ninth transistor M9 and the tenth transistor M10, namely, the conducted state or the cut-off state. When the EN signal is at a high level, the ninth transistor M9 and the tenth transistor M10 are conducted, and the LIO is connected to the MIO. In other words, MIO connection between different banks is implemented, or connection between the LIO and the MIO in different sections is implemented. When the EN signal is at a low level, the ninth transistor M9 and the tenth transistor M10 are cut off, and the LIO is not connected to the MIO. In other words, MIO disconnection between different banks is implemented, or disconnection between the LIO and the MIO in different sections is implemented.

Further, the memory may include a plurality of channels (CHs), and each of the plurality of channels includes the storage circuit 1. For example, with reference to (a) in FIG. 5, it is assumed that the memory includes eight CHs that are respectively represented as CH 1 to CH 8, and each CH includes eight banks that are represented as B1 to B8. A structure of the memory may be shown in FIG. 8.

In an embodiment of this disclosure, when two or more banks in the memory share a GSA and an MIO and share a plurality of circuits such as a column decoder and a row decoder, and when the memory includes a same quantity of banks compared with that of a memory in the conventional technology, a quantity of GSAs can be reduced, a length and a load of the MIO can be reduced, and quantities of column decoders and row decoders can be reduced, so that an area and power consumption of the memory are reduced.

On the basis of this, an embodiment of this disclosure further provides a storage apparatus. The storage device includes a printed circuit board (PCB) and a memory that is connected to the printed circuit board. The memory may be any memory provided above. The printed circuit board is configured to provide an electrical connection for an electronic component included in the memory. Optionally, the storage device may be user equipment or a terminal device of different types, for example, a computer, a mobile phone, a tablet computer, a wearable device, or a vehicle-mounted device. The storage device may alternatively be a network device, for example, a base station.

Optionally, the storage device may further include a package substrate. The package substrate is fastened on the printed circuit board PCB by using a solder ball, and the memory is fastened on the package substrate by using the solder ball. The package substrate is configured to package the memory.

According to another aspect of this disclosure, a storage apparatus is further provided. The storage apparatus includes a controller and a memory. The controller is configured to control read/write of the memory. The memory may be any memory provided above.

Figure 9:
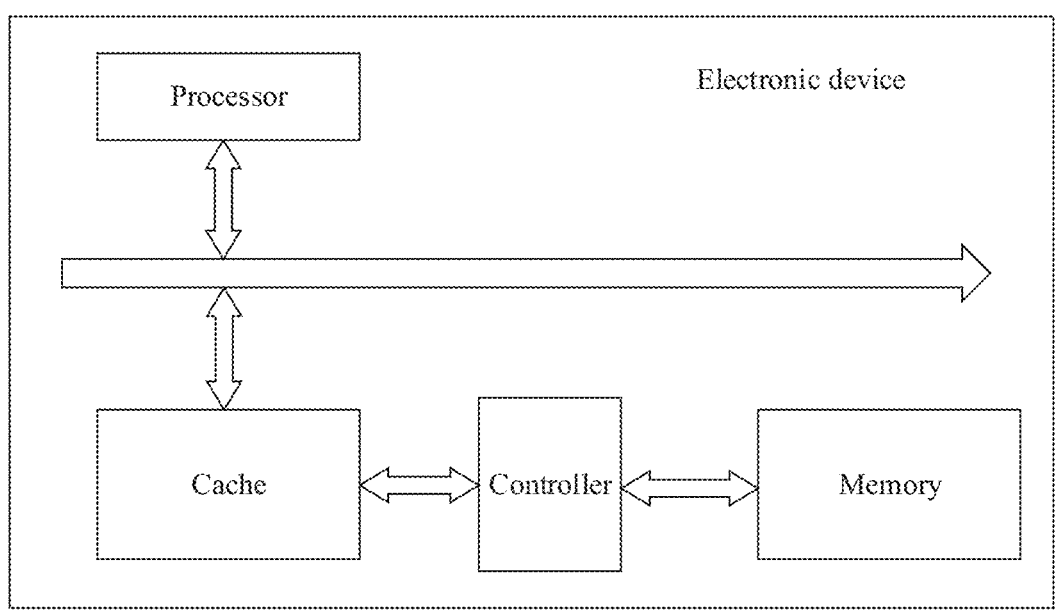
FIG. 9 is a schematic diagram of a structure of an electronic device according to an embodiment of this disclosure.

According to another aspect of this disclosure, an electronic device is further provided. As shown in FIG. 9, the electronic device includes a processor and a memory that are coupled to each other. The memory is any memory provided above. Optionally, the electronic device further includes a cache and a controller. The processor, the cache, the controller, and the memory may be integrated together. The memory may be coupled to the cache by using the controller, and may be coupled to the processor by using the cache.

It should be noted that the foregoing related descriptions of the memory may be correspondingly cited to the storage apparatus and the electronic device provided in this disclosure. For specific descriptions, refer to the foregoing descriptions corresponding to FIG. 3 to FIG. 8. Details are not described in embodiments of this disclosure again.

In conclusion, the foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

What is claimed is:

1. A memory, wherein the memory comprises:
   a storage circuit, comprising:
      a first bank;
      a second bank;
      a first global data amplifier, wherein the first bank and the second bank share the first global data amplifier;
      first middle input/output (MIO) routing, configured to connect the first bank, the second bank, and the first global data amplifier, wherein the first bank and the second bank share the first MIO;
      global input/output (GIO) routing; and an interface circuit, wherein the first global data amplifier is coupled to the interface circuit through the GIO routing.

2. The memory according to claim 1, wherein the storage circuit further comprises a first column decoder shared by the first bank and the second bank.

3. The memory according to claim 1, wherein the storage circuit further comprises:

a first column decoder corresponding to the first bank; and a second column decoder corresponding to the second bank, wherein the first column decoder and the second column decoder share at least one of the following: a decoding power supply circuit or decoding input/output interface routing.

4. The memory according to claim 1, wherein the storage circuit further comprises:

a first row decoder;

a third bank; and a fourth bank, wherein the first bank, the second bank, the third bank, and the fourth bank share the first row decoder.

5. The memory according to claim 4, wherein the storage circuit further comprises:

a second global data amplifier, wherein the third bank and the fourth bank share the second global data amplifier.

6. The memory according to claim 5, wherein the storage circuit further comprises:

a second MIO configured to connect the third bank, the fourth bank, and the second global data amplifier, wherein the third bank and the fourth bank share the second MIO.

7. The memory according to claim 4, wherein the third bank and the fourth bank share the first global data amplifier.

8. The memory according to claim 7, wherein the third bank and the fourth bank share the first MIO, and the first MIO is further configured to connect the third bank and the fourth bank.

9. The memory according to claim 4, wherein the storage circuit further comprises a third column decoder shared by the third bank and the fourth bank.

10. The memory according to claim 1, wherein the storage circuit further comprises:

a selection circuit, configured to select a bank from the first bank and the second bank to connect to the first global data amplifier.

11. The memory according to claim 10, wherein each of the first bank and the second bank comprises at least one section, and the selection circuit is further configured to:

select the at least one section of one of the first bank or the second bank to connect to the first global data amplifier.

12. The memory according to claim 11, wherein the at least one section comprises a plurality of memory arrays, and the selection circuit is further configured to:

select one of the plurality of memory arrays to connect to the first global data amplifier.

13. The memory according to claim 1, wherein the interface circuit comprises:

a first interface circuit configured to: input or output data, and convert the data; and a second interface circuit configured to: input or output a command, and decode or convert the command.

14. The memory according to claim 1, wherein the storage circuit further comprises at least one of the following circuits that are coupled to the GIO routing: a power supply circuit or a test circuit.

15. A storage apparatus, wherein the storage apparatus comprises:

a controller; and a memory, wherein the controller is configured to control read/write of the memory, and wherein the memory comprises:

a storage circuit, comprising:

a first bank;

a second bank;

a first global data amplifier, wherein the first bank and the second bank share the first global data amplifier;

first middle input/output (MIO) routing, configured to connect the first bank, the second bank, and the first global data amplifier, wherein the first bank and the second bank share the first MIO;

global input/output (GIO) routing; and an interface circuit, wherein the first global data amplifier is coupled to the interface circuit through the GIO routing.

16. The storage apparatus according to claim 15, wherein the storage circuit further comprises:

a first column decoder shared by the first bank and the second bank.

17. The storage apparatus according to claim 15, wherein the storage circuit further comprises:

a first column decoder corresponding to the first bank; and a second column decoder corresponding to the second bank, wherein the first column decoder and the second column decoder share at least one of the following: a decoding power supply circuit or decoding input/output interface routing.

18. The storage apparatus according to claim 15, wherein the storage circuit further comprises:

a selection circuit, configured to select a bank from the first bank and the second bank to connect to the first global data amplifier.

19. The storage apparatus according to claim 18, wherein each of the first bank and the second bank comprises at least one section, and the selection circuit is further configured to:

select the at least one section of one of the first bank or the second bank to connect to the first global data amplifier.

20. The storage apparatus according to claim 19, wherein the at least one section comprises a plurality of memory arrays, and the selection circuit is further configured to:

select one of the plurality of memory arrays to connect to the first global data amplifier.

* * * * *